United States Patent [19]

Tepman

[11] Patent Number: 5,527,438
[45] Date of Patent: Jun. 18, 1996

[54] CYLINDRICAL SPUTTERING SHIELD

[75] Inventor: Avi Tepman, Cupertino, Calif.

[73] Assignee: Applied Materials, Inc., Santa Clara, Calif.

[21] Appl. No.: 357,001

[22] Filed: Dec. 16, 1994

[51] Int. Cl.⁶ ................................................. C23C 14/35
[52] U.S. Cl. .................... 204/192.12; 204/298.11
[58] Field of Search .................. 204/192.12, 298.06, 204/298.11

[56] References Cited

U.S. PATENT DOCUMENTS

| | | | |
|---|---|---|---|
| 3,410,774 | 11/1968 | Barson et al. | 204/192.32 |
| 3,640,812 | 2/1972 | Vossen, Jr. et al. | 204/192.17 |
| 4,508,612 | 4/1985 | Blackwell et al. | 204/298.11 |
| 4,521,286 | 6/1985 | Horwitzz | 204/192.32 |
| 4,523,971 | 6/1985 | Cuomo et al. | 156/345 |
| 4,588,490 | 5/1986 | Cuomo et al. | 204/298.06 |
| 4,704,306 | 11/1987 | Nakamura | 427/100 |
| 4,717,462 | 1/1988 | Homma et al. | 204/298.06 |
| 4,724,060 | 2/1988 | Sakata | 204/298.11 |
| 4,824,544 | 4/1989 | Mikalesen et al. | 204/298.06 |
| 4,988,424 | 1/1991 | Woodard et al. | 204/192.29 |
| 5,223,108 | 6/1993 | Hurwitt | 204/192.12 |
| 5,393,398 | 2/1995 | Sugano | 204/298.11 |

FOREIGN PATENT DOCUMENTS

| | | | |
|---|---|---|---|
| 57-120669 | 7/1982 | Japan | 204/298.06 |
| 58-67016 | 4/1983 | Japan | 204/298.11 |
| 61-117276 | 6/1986 | Japan . | |
| 61-117273 | 6/1986 | Japan | 204/298.11 |
| 63-79968 | 4/1988 | Japan | 204/192.2 |
| 63-255368 | 10/1988 | Japan . | |
| 63-307256 | 12/1988 | Japan | 204/192.15 |
| 1-208460 | 8/1989 | Japan | 204/298.11 |
| 6-60390 | 10/1994 | Japan | 204/298.11 |

OTHER PUBLICATIONS

Sputtering Apparatus, [Scope of claim for Patent] Publication Date Aug. 10, 1994 Kokai 63-310965.

Japanese Kokai Patent Application No. SHO 61[1986]-117273 (Translation) Publication Date Jun. 4, 1986.

*Primary Examiner*—Aaron Weisstuch
*Attorney, Agent, or Firm*—Donald Verplancken; B. Todd Patterson; Jeffrey L. Streets

[57] ABSTRACT

A sputtering apparatus deposits a material layer on a substrate. The apparatus includes a tube extending partially between the target and substrate, to selectively prevent portions of the target material flux from reaching the substrate to provide a more symmetrical deposition flux at each region of the substrate. In one aspect, the tube includes a single tubular wall which provides an inner and an outer particle blocking surface. The upper end of the inner surface of the tube is positioned to block, from the substrate edge, that portion of the sputtering target surface inward of the substrate edge which exceeds the target surface located outward of the substrate edge, and the lower surface of the outer wall is located to block access of particles sputtered from the edge of the target to the center of the substrate.

33 Claims, 7 Drawing Sheets

CYLINDRICAL SPUTTERING SHIELD

BACKGROUND OF THE INVENTION

1. Field of the Invention

The present invention relates to the deposition of material layers onto semiconductor substrates by sputtering. More particularly, the present invention relates to the deposition of material layers by sputtering wherein the surfaces of any apertures extending into the uppermost surface of the substrate, such as holes or trenches, must be conformally covered by the material layer deposited on the substrate, and the thickness of the from layer deposited on the side walls of each of the holes or trenches, and the thickness of the deposition layer formed on the base of each of the holes or trenches, should be substantially equal at each location on the substrate.

2. Background of the Invention

Sputtering is one well known method of depositing a film layer on a semiconductor substrate. A typical sputtering apparatus includes a target and a substrate support pedestal enclosed in a vacuum chamber. The target is typically affixed to the top of the chamber, but is electrically isolated from the chamber walls. A voltage source maintains the target at a negative voltage with respect to the walls of the- chamber, thereby exciting a gas, which is maintained in the chamber at a low pressure, into a plasma. Ions from this plasma sputter the target.

As a first order approximation, the trajectories of the particles sputtered from any point on the target have a cosine angular distribution; that is, the density of sputtered particles ejected from a point on the target along a trajectory having a given angle from perpendicular to the target is proportional to the cosine of such angle. The target particles sputtered from the target generally travel in a straight line path and will tend to deposit on any surface that they contact.

One application of sputtering is to provide a conformal metal deposition layer on the surfaces of holes or trenches extending through one or more metal, dielectric or semiconducting film layers on the uppermost surface of the substrate. The metal deposited on the substrate by sputtering the target must form a continuous, i.e., conformal, coating on the wall and base of the holes or trenches.

To ensure that all conductors deposited on a substrate have the same resistivity, the metal must be deposited with a uniform thickness. Ideally, the thickness of the metal film layer deposited on the base of a hole or trench should be no different for holes near the periphery of the substrate than for holes near the center of the substrate. Furthermore, the thickness of the film layer deposited on the side wall of each of the holes or trenches should be symmetrical, and the film layer should also have a relatively uniform thickness over the entire height of the wall or span of the base of each hole or trench. Moreover, the film layer formed on the side wall of any of the holes or trenches should have the same thickness and symmetry as that formed on the sidewall of every other hole or trench. However, the film layer formed on the base of the hole or wench may be of a different thickness than the film layer formed on the wall of the hole or trench.

The uniformity of the film layer deposited on the wall and base of each hole or trench is dependent on the angular distribution of the trajectories of the individual particles of target material reaching each of the holes or trenches. Particles travelling in paths that are substantially perpendicular to the substrate surface will pass through the open end of the hole or trench and deposit on the hole or trench base. Particles travelling at angles from perpendicular to the substrate surface will typically deposit on the hole wall and on the upper surface of the substrate.

One common problem in sputtering systems is that asymmetric side wall coverage occurs in holes adjacent to the edge of the substrate. At an edge location, the quantity of target material reaching the hole from regions of the target located inwardly of the hole location exceeds the quantity of target material from the target regions located outwardly of the hole location. As a result, the film layer formed on the hole wall will be thickest on the outward side of the hole and thinnest at the inward side of the hole.

An additional problem with sputtering systems is the formation of voids when attempting to fill holes near the center of the substrate surface. At this location, the peripheral region of the target supplies a large quantity of particles which are travelling at highly oblique angles with respect to the surface of the substrate. These particles will deposit on the upper end of the hole walls and the surface of the substrate adjacent to the hole. The deposit formed from these particles will overhang the hole opening and thereby block the access of other target particles to the base of the hole and the lower side walls of the hole adjacent to the base of the hole. As a result, an overhanging deposition layer forms over the hole opening, and a non-filled region (i.e., a "void") remains within the hole.

A conventional solution to these problems is to provide a perforated collimator plate between the target and the substrate. The perforations have a ratio of length to diameter sufficient to screen out (i.e., block) target particles travelling in paths which are substantially oblique to the upper surface of the substrate. The screening is provided because the obliquely travelling particles collide with, and deposit on, the walls of the collimator holes. Because the portion of the target particle flux travelling obliquely to the substrate surface is screened out, the flux reaching each location on the substrate is contributed only by the portion of the target directly above the hole in the substrate, i.e., it is provided through the hole in the plate collimator directly above each substrate location. This provides a symmetrical flux at each location on the substrate reduces the deposition of overhanging material which can create un-filled voids within the holes, and thereby facilitates uniform, symmetrical filling of the holes with the target material.

However, the plate collimator has several disadvantages. First, a substantial quantity of the particles sputtered from the target are wasted by being deposited on the surfaces of the collimator. Typically at least 50%, and in some applications as much as 90%, of the material which would otherwise reach the substrate is screened out by the collimator. Additionally, the collimator holes quickly fill with deposited particles, which particles block the holes and reduce the hole width. Eventually the particles will substantially block or completely fill the holes and the plate collimator must be cleaned or replaced, thereby incurring costly idle time of the equipment during maintainence as well as the cost of the replacement pans. Finally, target particles may collide with the underside of the plate collimator at low energies, thereby forming loosely attached deposits which can fall onto, and thereby contaminate, a substrate.

Therefore, a need exists for a sputtering apparatus capable of depositing a uniform, symmetrical, conformal film in holes or trenches as well as on the surface of the substrate, with minimal maintenance requirements and minimal contamination of the substrate.

SUMMARY OF THE INVENTION

The present invention provides a collimator or screening tube for improving the uniformity of films sputter-deposited on the base and side walls of holes or trenches in the surface of a semiconductor substrate. According to the invention, the tube is placed in the deposition chamber between the target and the substrate with its axis oriented substantially perpendicular to both the target and the substrate. In the most common application in which the target and substrate both have approximately flat, circular surfaces, the tube is cylindrical or annular.

In one aspect of the invention, the tube is positioned so as to block material sputtered off of a point within a peripheral region of the target from depositing on the diagonally opposite region on the surface of the substrate. Specifically, the tube is positioned so as to intersect a linear path between a point near the perimeter of the target surface and a point near the farthest (i.e., diagonally opposite) edge of the substrate surface. Consequently, the tube blocks the path of the sputtered material having the most oblique trajectories which otherwise would deposit on the periphery of the substrate surface. This feature facilitates void-free filling of high aspect ratio holes near the periphery of the substrate, because it reduces the formation of overhanging deposition which can cover the tops of the holes while leaving untilled voids within the holes.

Preferably, the upper end of the tube extends sufficiently close to the target to also prevent material sputtered from a central region of the target from reaching the periphery of the substrate. This feature further reduces the amount of material allowed to deposit on the periphery of the substrate at highly oblique angles, thereby further reducing the formation of overhanging deposition which can produce untilled voids within holes.

This invention also reduces the tendency of holes near the periphery of the substrate to have thicker deposition on their outer walls than their inner walls. This advantage accrues because the tube blocks some of the sputtered material having outward trajectories which otherwise would deposit on the outer walls of holes near the periphery of the substrate, but it does not block any material having inward trajectories which deposits on the inner walls of holes near the periphery of the substrate.

Preferably, the deposition on the inner and outer walls of the holes near the substrate periphery is equalized by optimal selection of (a) the tube diameter and (b) the distance between the upper end of the tube and the target. Specifically, increasing the tube diameter and decreasing the gap between the upper end of the tube and the target will decrease deposition on the outer walls of holes near the periphery of the substrate. However, a given tube diameter and upper extension will produce optimal (i.e., equal and symmetrical) side wall coverage only for holes at a specific radial distance from the center of the substrate. Therefore, the optimization inherently is only approximate. Preferably, the tube dimensions are optimized for holes at a radial distance from the center which is slightly less than the perimter of the substrate.

In a second aspect of the invention, the tube is positioned to prevent material sputtered from the periphery of the target surface from reaching the center of the substrate. Specifically, the tube is positioned so as to intersect a linear path between a point near the perimeter of the target surface and a point near the center of the substrate surface. Consequently, the tube blocks the path of the sputtered material having the most oblique trajectories which otherwise would deposit on the center of the substrate surface. This feature facilitates void-free filling of high aspect ratio holes near the center of the substrate, because it reduces the formation of overhanging deposition which can cover the tops of the holes while leaving untilled voids within the holes. Also, by blocking some of the sputtered material from reaching the center of the substrate, this feature reduces the tendency of the deposited film to be thicker near the center of the substrate than the periphery of the substrate.

A collimator or screening tube can be advantageously dimensioned and positioned according to either the first or the second aspects of the invention as defined above, the first aspect being to improve deposition near the periphery of the substrate, and the second aspect being to improve deposition near the center of the substrate. Most preferably, the tube is dimensioned and positioned so as to simultaneously implement both the first and second aspects of the invention. Specifically, for a given diameter tube, the lower end extends sufficiently close to the substrate to implement the second aspect of the invention, and the upper end extends sufficiently close to the target to implement the first aspect of the invention.

In a further aspect of the invention, multiple concentric tubes may be provided between the substrate and the target in a vertically nested and/or staggered configuration, to provide the deposition characteristics of the present invention with different target erosion profiles and different target and substrate sizes and geometries, and to provide enhanced symmetry of the deposition material reaching locations between the center and the edge of the substrate.

These, and other features of the invention will be apparent from the description of the embodiments, when read in conjunction with the following drawings, wherein:

DETAILED DESCRIPTION OF THE PREFERRED EMBODIMENTS

Figure 1:
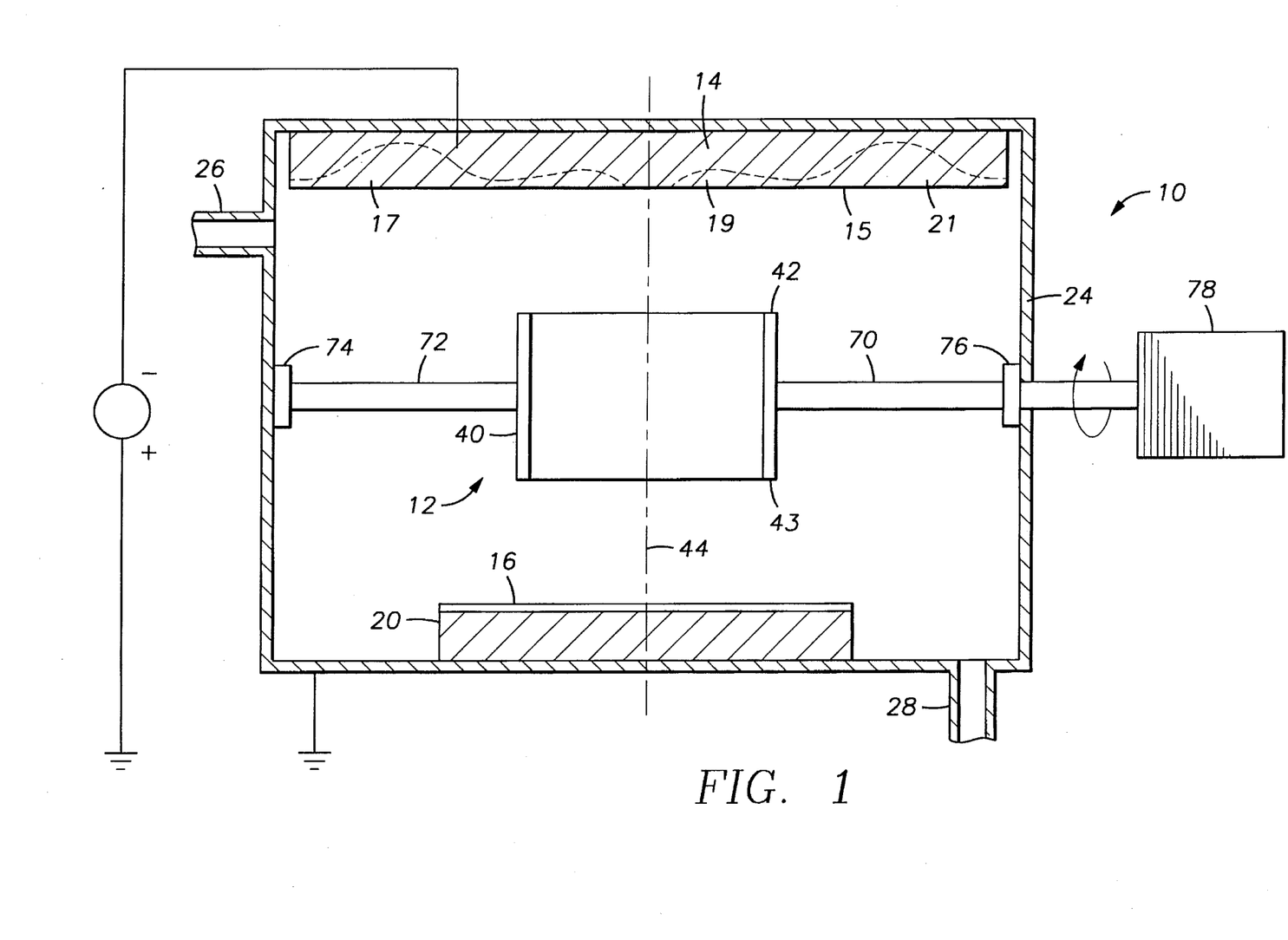
FIG. 1 is a diagrammatic illustration, in section, of the essential portions of the sputtering apparatus of the present invention.

The sputtering apparatus and method of the present invention generally contemplates the positioning of a tube 12 between a sputtering target 14 and a semiconductor substrate 16 in a conventional sputter deposition chamber 10 as shown in FIG. 1. The tube 12 blocks a portion of the target particles traveling obliquely with respect to the substrate surface to provide a more uniform and symmetrical flux of deposition material to each location on the substrate.

CONVENTIONAL PORTIONS OF THE SPUTTERING CHAMBER

Referring still to FIG. 1, the sputtering chamber 10 for practicing our invention generally includes a vacuum chamber enclosure wall 24 having at least one gas inlet 26 and an exhaust outlet 28 connected to an exhaust pump (not shown). A substrate support pedestal 20 is disposed at the lower end of the chamber 10, and a sputtering target 14 is mounted to the upper end of the chamber 10. The target 14 is electrically isolated from the enclosure wall 24, and the enclosure wall 24 is preferably grounded, so that a negative voltage may be maintained on the target 14 with respect to the grounded enclosure wall 24. In operation, the substrate 16 is positioned on the support pedestal 20. The support pedestal 20 has a substrate receiving surface having substantially the same surface area as the substrate 16 to be received thereon.

During the deposition process a gas, typically a non-reactive species such as Ar, is charged into the vacuum chamber 10 through the gas inlet 26 at a selected flow rate regulated by a mass flow controller. The chamber pressure is controlled by throttling the rate at which chamber gases are pumped through the exhaust outlet 28.

A D.C. power supply applies a negative voltage to the target 14 with respect to the enclosure wall 24 so as to excite the gas into a plasma state. Ions from the plasma bombard the target 14 and sputter atoms and larger particles of target material from the target 14. The particles sputtered from the target 14 travel along linear trajectories from the target 14, and a portion of the particles collide with, and deposit on, the substrate 16.

A conventional magnetron sputtering source employs a magnet (not shown) above the target 14 to increase the concentration of plasma ions adjacent to the sputtering surface of the target 14, and particularly in one or more annular regions intermediate the center and the perimeter of the target 14. Initially, the target 14 is supplied to the chamber with a planar sputtering surface 15 as shown in FIG. 1. As successive substrates are processed by sputtering the target 14, the target 14 takes on an erosion profile 17 as shown, in phantom, in FIG. 1, wherein the annular regions of strongest magnetic field created by the magnetron create a minor enhanced annular erosion region 19 and a major enhanced annular erosion region 21.

HOLE FILLING PROBLEMS IN THE PRIOR ART

Figure 2:
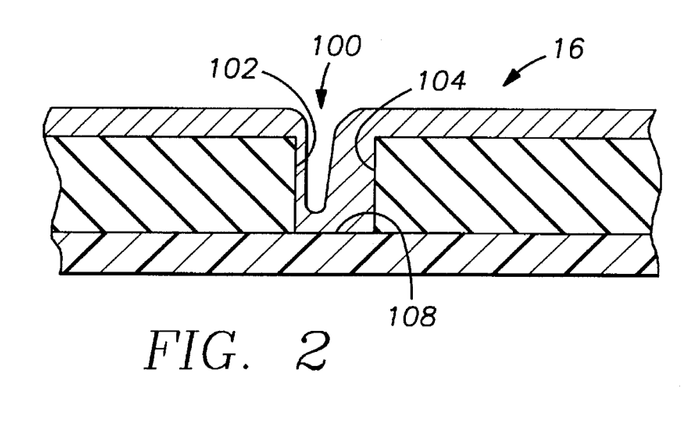
FIG. 2 is a partial sectional view of a hole location adjacent the center of a substrate showing the conformal coverage of the hole without the presence of the tube of the present invention.
Figure 3:
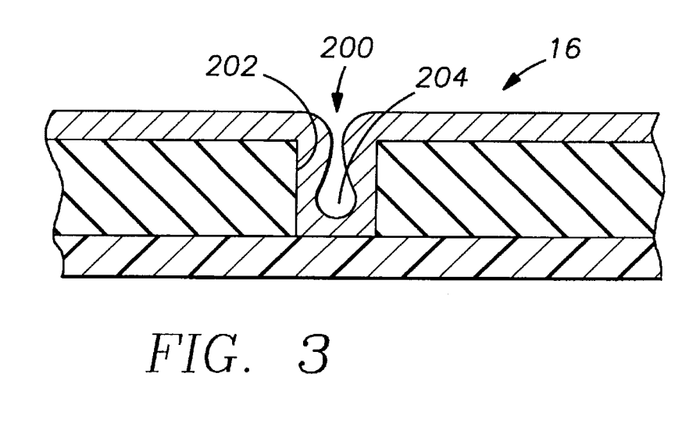
FIG. 3 is a partial sectional view of a hole location adjacent the edge of a substrate showing the conformal coverage of the hole without the presence of the tube of the present invention.

FIGS. 2 and 3 illustrate typical shortcomings of conventional uncollimated sputter deposition systems in depositing material within holes or trenches on the surface of a semiconductor substrate. (As explained in the Background of the Invention, conventional perforated collimators overcome these shortcomings, but introduce serious maintenance requirements for frequent cleaning or replacement of the collimator.)

Figure 4:
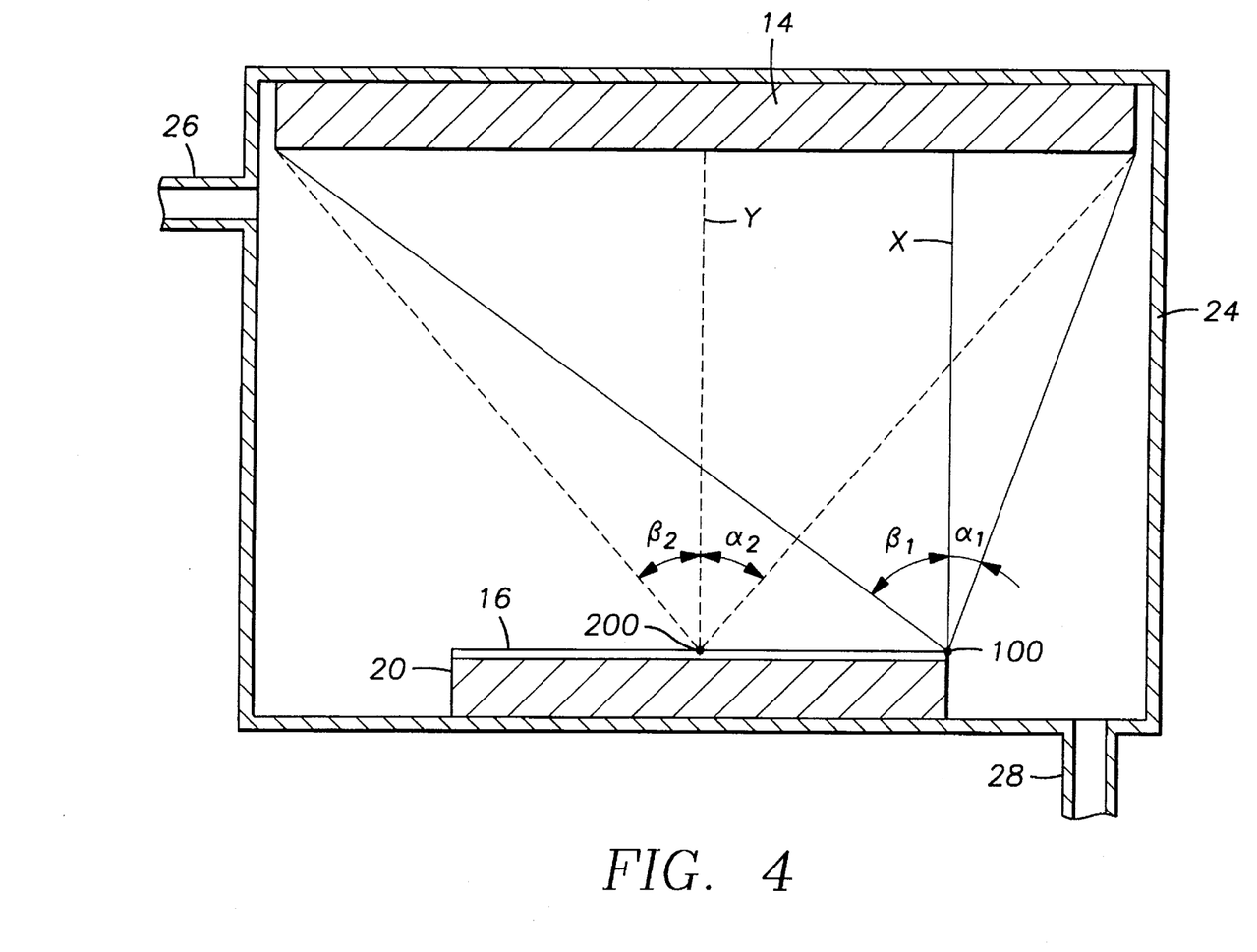
FIG. 4 is a simplified sectional view of an arrangement of the sputtering chamber without the tube of the present invention.

FIG. 2 illustrates the typical deposition profile within a hole 100 near the perimeter of the substrate as shown in FIG. 4. The deposited film is asymmetrical, being thinnest on the inward wall 102 of the hole 100 and thickest on the outward wall 104 of the hole 100. (The inward and outward walls are the hole side walls closest to the center and perimeter of the substrate, respectively.)

FIG. 3 illustrates the typical deposition profile within a hole 200 near the center of the substrate as shown in FIG. 4. The deposited film overhangs the opening 202 of the hole 200, and an unfilled void 204 remains within the hole 200.

FIGS. 2 and 3 are based on actual tests using an eight inch diameter substrate 16 spaced eight inches from a thirteen inch diameter target 14. The minor enhanced annular sputtering region 19 was located at a one inch radius from the target 14 center. The major enhanced annular sputtering region 21 was located at a five inch radius from the center of the target 14.

THE CAUSE OF ASYMMETRICAL DEPOSITS IN THE PRIOR ART

The cause of the asymmetrical deposition in a hole or trench 100 near the perimeter of the substrate may be understood from a review of the geometry of a typical sputtering apparatus shown in FIG. 4. (The following analysis is a good approximation, but it is not exact, because it considers the sputtering distribution only in the two dimensions of the plane of FIG. 4, not the more complex three-dimensional distribution pattern.) At the hole 100, a relatively small area of the target located outward of the hole (included within an angle $\alpha_1$ from a line x perpendicular to the substrate at hole 100) supplies target particles to the inner wall 102 of hole 100 whereas a much larger area of the target located inward of the hole 100 (included within an angle $\beta_1$ from a line x perpendicular to the substrate 16 at hole 100) supplies target material to the outer wall 104 of hole 100. Consequently, the outward side 104 of the hole or trench receives deposition material at a much greater rate than that reaching the inward side 102 (as shown in FIG. 2), so that the film deposited in the hole is asymmetrical.

In contrast, at a hole 200 near the center of the substrate, the deposition on the walls is symmetrical. The target material sputtered from the portion of the target 14 to the right of a line y perpendicular to the surface of the substrate 16 at hole 200 is included within an angle $\alpha_2$ which approximately equals the target material sputtered from the portion of the target 14 included within an angle $\beta_2$ to the left of the line y.

THE OVERHANG PROBLEM OF THE PRIOR ART

However, because sputtered material travels to a central hole 200 over a wide range of angles $\alpha_2$ and $\beta 2$, a substantial portion of the material depositing on the hole 200 arrives at highly oblique angles. Sputtered material having such highly oblique trajectories cannot pass very deeply into a high aspect ratio hole 200. Therefore, a disproportionate amount of material deposits on the uppermost portion of the hole walls as shown in FIG. 3, which can produce an overhang of material which closes the top of the hole while leaving an untilled void 204 within the hole.

NOVEL TUBE BETWEEN THE TARGET AND THE SUBSTRATE

To improve the deposition profile of the film layer deposited in the holes from that shown in FIGS. 2 and 3, the tube 12 is placed between the target 14 and the substrate 16 as shown in FIG. 1. Uniquely, both the inner and outer surfaces of the tube 12 wall provide surfaces to block selected regions of the target 14 from selected regions of the substrate 16, and thereby provide a symmetrical target material flux at the center and the edge of the substrate 16, and simultaneously reduce the quantity of target particles which are travelling at highly oblique angles with respect to the top-most surface of the substrate 16.

Preferably, the exposed surfaces of tube 12 are composed of a material which is non-contaminating to the chamber when exposed to a plasma. Therefore, the tube 12 is preferably manufactured from the same material as the target 14. The tube 12 is suspended in the chamber 10 between the substrate 16 and target 14 on opposed co-linear rods 70 and 72, which are connected to the tube wall 40 approximately 180° apart, midway between the upper annular end 42 and lower annular end 43 of the tube 12. The rod 72 is mounted to the chamber wall 24 through a sealed rotary coupling 76, and the rod 70 extends from the tube wall 40 and through a second sealed rotary coupling 74 in the chamber wall 24. A motor 78, or other rotary drive member, is attached to the end of the rod 70 outwardly of the chamber 10, to selectively rotate the tube 12 as will be further described herein.

The tube 12 provides collimation on a gross scale, i.e., it screens from the stream of target particles passing from the target 14 to the substrate 16 a portion of the target particles which are travelling at highly oblique trajectories with respect to the surface of the substrate 16 (i.e., trajectories at low angles relative to the plane of the substrate surface).

In one aspect of the invention the tube 12 is positioned to block the edge of the target 14 from the center of the substrate 16. This eliminates, from the flux of target particles, those particles travelling at highly oblique angles with respect to the top-most surface of the substrate 16 to eliminate overhang in the deposit formed in the holes at the center of the substrate 16.

In another aspect of the invention, the tube 12 is positioned to block, from the edge of the substrate 16, that portion of the target 14 located inwardly of the edge of the substrate which exceeds the area of the target located outward of the substrate edge. This provides a symmetrical flux of target particles; to the substrate edge.

In a further aspect of the invention, the tube is configured to provide both the overhang elimination and symmetry enhancing features. In this configuration, the deposition layer formed in holes at the center and edge of the substrate will have the same symmetry and the deposition layer formed in holes at positions between the center and edge of the substrate will have enhanced symmetry, and the holes adjacent to the center of the substrate will have reduced overhang, as compared to the prior art non-collimated sputtering systems without the disadvantages of the prior art plate collimator.

In each aspect of the invention, the substrate to target spacing preferably is a long-throw spacing, i.e., the distance between the target 14 and the substrate 16 is at least approximately equal to the diameter of the substrate 16. The long throw distance, or slightly lesser spacing between the target 14 and the substrate 16 which typically exceeds the prior art spacing, typically is necessitated by the length of the tube 12 and by the necessary spacing between the tube ends and the adjacent substrate 16 arid target 14 surfaces, all of which may be optimized according to the following design methodology.

OPTIMIZING DESIGN TO AVOID OVERHANG NEAR SUBSTRATE CENTER

The size and position of the tube 12 can be optimized to eliminate overhanging deposition over holes 200 (see FIG. 4 or 5) near the center of the substrate 16. Initially, a first order approximation of the tube 12 size and position is made, and then the size and/or position of the tube 12 is incrementally changed from that of the first order approximation until an optimum symmetry and film thickness uniformity are provided by the tube 12.

The only initial constraints on the size and position of the tube 12 are: (1) the spacing between the upper annular end 42 of the tube and the target 14 preferably is at least 1.5 inches so that the tube 12 does not interfere with the plasma sheath adjacent to the target 14, and (2) the lower annular end 43 of the tube 12 preferably is spaced at least 1.5 inches from the deposition receiving face of the substrate 16 to prevent shadowing of the substrate 16 by the tube 12.

Within these constraints, the first order approximation of the tube 12 size and position to eliminate overhang at the center of the substrate 16 is determined for a given size and spacing of the substrate 16 and the target 14. The first order approximation may be made with a scaled drawing of the chamber 10, the substrate 16, the target 14 and the target to substrate spacing.

Figure 5:
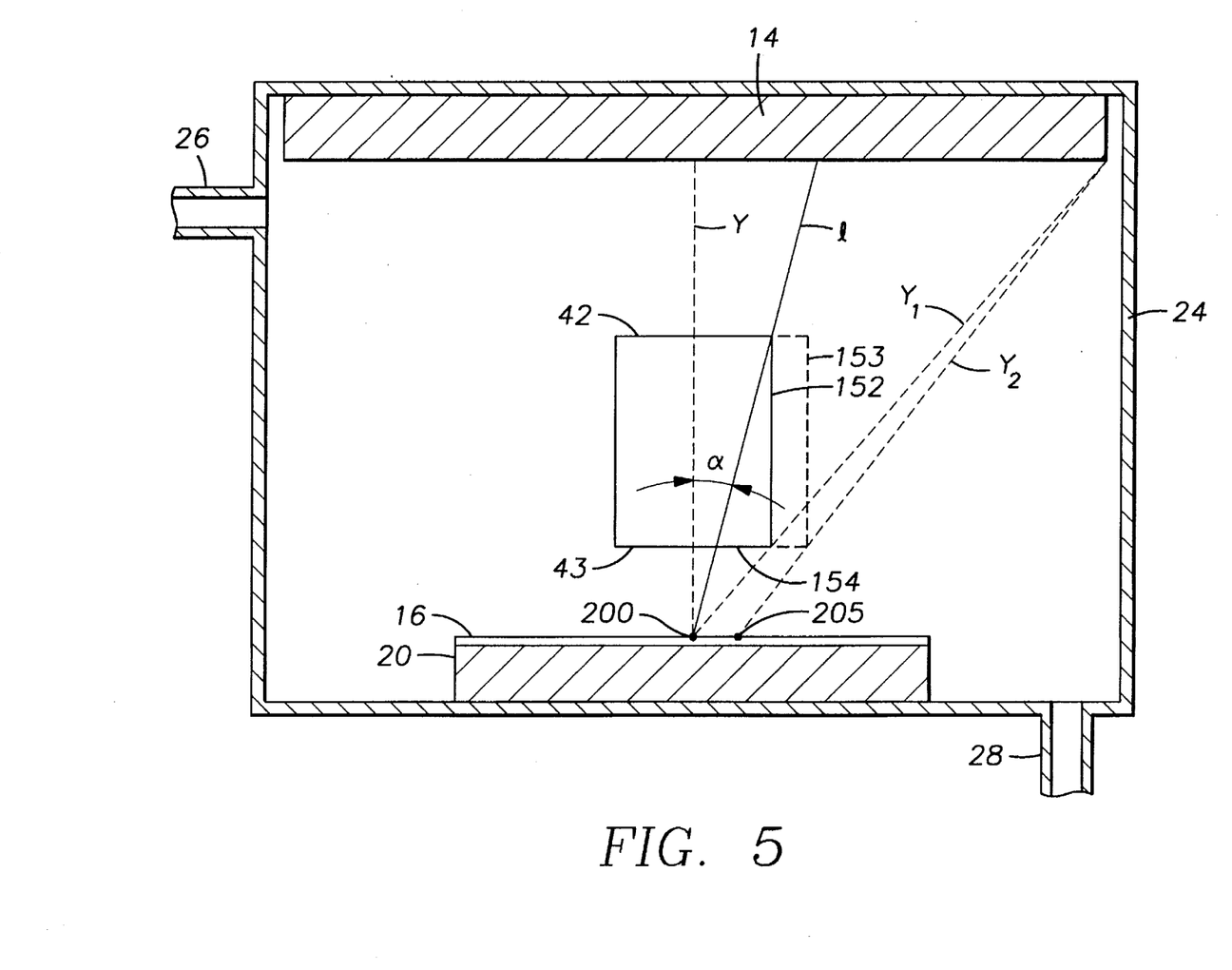
FIG. 5 is a simplified sectional view of the sputtering chamber including the tube of the present invention configured to provide substrate edge symmetry.

Referring to FIG. 5, to begin the first order approximation of the size and position of the tube 12, the substrate 16 and the target 14 are drawn into a schematic representation, to scale, of a sputtering chamber 10, with an arbitrary scaled spacing between the substrate 16 and the target 14 of eight inches. A reference line y is then established perpendicular to, and passing through the center of, both the target 14 and the substrate 16.

In the first order approximation, the lower annular end 43 of the tube 12 is located the minimum distance from the substrate 16, as shown by reference line 154. The lower annular end 43 of the tube 12 is chosen as the baseline from which the tube 12 is sized and positioned, because the lower regions of the wall 40 provide the blocking of the target edge region from the substrate center.

To determine the tube 12 diameter, a reference line $y_1$ is drawn from the center of the substrate 16 to the edge of the target 14. The intersection of this reference line $y_1$ and the reference line 154 establishes the diameter of the tube 12. A line segment 152, which represents the outer surface of the tube wall 40, is then drawn upwardly from the intersection of the reference lines y and 154. A mirror image of line segment 152 is also drawn on the FIGURE on the opposite side of the center line y, so as to represent the opposite side of cylindrical wall 40 at a position 180° from the first reference line 152.

To determine the tube height, a second reference line "1" is extended from the center of the substrate 16 at a selected angle γ with respect to center line y. The angle γ is selected to be small enough that blocking sputtered material from depositing on the center of the substrate at angles greater than γ will enable holes and trenches near the center of the substrate to be filled without voids. The intersection of reference line "1" with reference line 152 establishes the position of the upper annular end 42 of the tube 12, which is drawn in parallel to lower annular end 43 to complete the sectional view of the tube 12.

The tube diameter determined in accordance with the second preceding paragraph shields a hole 200 at the center of the substrate 16 from material sputtered from the edge of target, but it does not completely shield a hole 205 that is somewhat offset from the center. Specifically, it shields such a point 205 from the diagonally opposite edge of the target, but not from the nearest edge of the target. Accordingly, it may be desirable to increase the diameter of the tube somewhat, as represented in FIG. 5 by the line segment 153. For a given diameter tube, and a given distance of the tube from the substrate, a reference line $y_2$ extending between the edge of the target and the nearest lower edge of the tube 12 will intersect the surface of the substrate at a point 205 representing the greatest radial distance a hole can be from the substrate center and still be shielded by the tube from material sputtered from the nearest edge of the target.

OPTIMIZING DESIGN TO REDUCE OVERHANG NEAR SUBSTRATE EDGE

Figure 6:
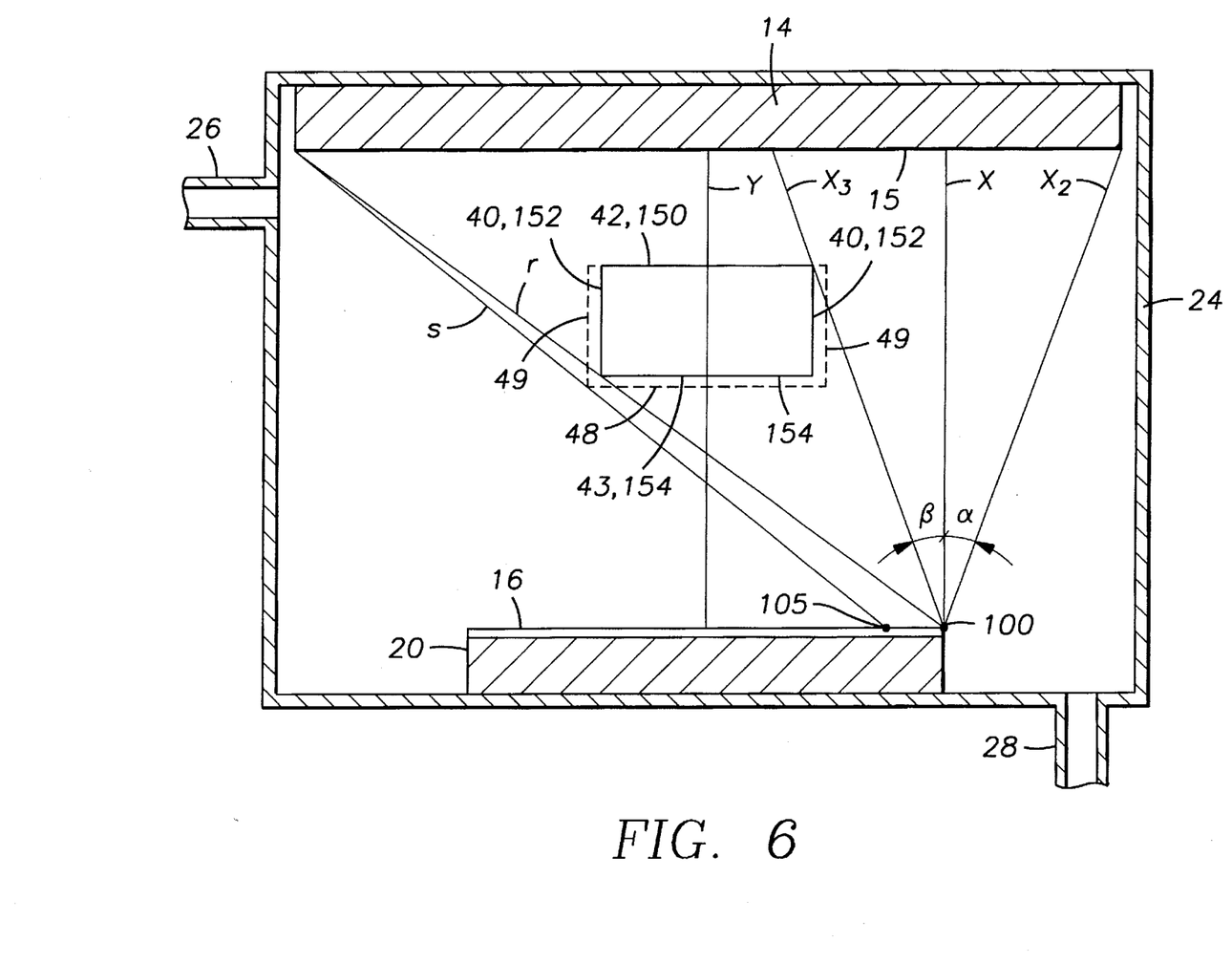
FIG. 6 is a simplified sectional view of the sputtering chamber including the tube of the present invention configured to eliminate overhang at holes in the central region of the substrate.

The size and position of the tube 12 can be optimized to reduce overhanging deposition over holes 100 near the perimeter of the substrate 16 (see FIG. 4 or 6). Overhanging deposition is caused by sputtered material having trajectories that are excessively oblique (i.e., non-perpendicular) relative to the surface of the substrate. Obliquely arriving material cannot penetrate deeply into high aspect ratio holes before striking a hole wall. Consequently, an excessive thickness of material deposits near the top of the hole which eventually can cover the hole before the hole is filled with sputtered material, thereby leaving an un-filled void within the hole.

Overhanging deposition is particularly prevalent near the perimeter of the substrate, because this region of the substrate receives sputtered material having the most oblique possible trajectories, namely, material sputtered from the diagonally opposite area of the target, shown in FIG. 6 as trajectory line "r". The tube 12 can reduce or eliminate overhanging deposition by blocking material sputtered from one edge of the target from reaching the diagonally opposite edge of the substrate. Referring to FIG. 6, this is accomplished if the tube 12 is positioned so that its side walls 152 intersect the path "r" extending from a hole 100 near one edge of the substrate to the diagonally opposite edge of the target.

Although the tube positioned as specified in the preceding paragraph shields a hole 100 near the edge of the: substrate 16 from receiving material sputtered from the diagonally opposite edge of the target, the tube does not shield a hole 105 that is somewhat inward of the peripheral hole 100. If it is desired to shield an annular region between holes 100 and. 105 from sputtered material originating from the diagonally opposite target edge, the tube 12 can be extended downward and/or increased in diameter as shown by phantom lines 48 and 49 in FIG. 6. A trajectory line "s" from the hole 105 and the diagonally opposite edge of the target should intersect the lower end of the tube at a point diagonally opposite the hole 105. Increasing the diameter of the tube, and/or increasing the axial extension of the tube toward the substrate, will increase the width of the annular area at the perimeter of the substrate that is shielded from material sputtered from the edge of the target.

Overhanging deposition can be further reduced by dimensioning the tube 12 to additonally block material having trajectories not quite as oblique as the worst case (maximally diagonal) trajectory "r". The tube wall extending upward (i.e., toward the target) from this intersection point will block material sputtered toward the edge of the substrate from target regions inward of the perimeter. Further lengthening the upward extension of the tube will additionally block material sputtered from a central region of the target from depositing on the edge of the substrate. Referring to FIG. 6, the tube will shield holes 100 adjacent the edge of the substrate from material sputtered from a large region of the target between the diagonal line "r" and the line $x_3$, where the line $x_3$ is the line extending from hole 100 to the nearest point on the upper (target facing) end 42 of the tube.

OPTIMIZING DESIGN FOR SYMMETRICAL WALL COVERAGE NEAR SUBSTRATE EDGE

The design can be optimized to overcome the conventional problem of holes near the perimeter of the substrate having thicker deposition on their outer walls than the inner walls. The tube 12 is sized and positioned to block the portion of the target area located inwardly of the edge location which exceeds the area of the target 14 located outwardly of the edge location from the substrate edge. The scaled layout of this configuration and methodology for sizing and positioning the tube to achieve symmetry are shown in FIG. 6.

To begin the first order approximation the upper (target facing) end 42 of the tube 12 is positioned as close as possible to the target 14. As stated earlier, the upper end should be far enough the from the target to avoid interference with thee plasma sheath, preferably about 1.5 inches from the surface of the target. In FIG. 6, a horizontal (parallel to the target) reference line 150 is drawn is drawn a scaled 1.5 inches from the sputtering surface 15 of the target 14 to establish the position of the tube upper end 42. The tube upper end 42 is used as the beginning reference location for sizing the tube 12 because the inner surface of the upper end of the tube wall shields the edge of the substrate from the central area of the target.

A reference line x is then drawn perpendicular to the substrate 16 at the hole 100 location adjacent to the edge of the substrate 16. A second reference line $x_2$ is drawn from the hole 100 to the nearest edge of the target 14, and the angle $\alpha_1$ between that reference line $x_2$ and reference line x is measured. A third reference line $x_3$ is drawn from the hole 100, on the inner side of reference line x and at an angle $\beta_1$ thereto, where $\beta_1 = \alpha_1$. The intersection of this line $x_3$ with the reference line 150 (representing the upper end 42 of the tube 12) establishes the diameter of the tube wall 40.

The amount of material sputtered onto the inner wall 102 of a hole 100 near the edge of the substrate is roughly proportional to the angle $\alpha_1$, and the amount of material sputtered onto the outer wall 104 is roughly proportional to the angle $\beta_1$. Because the upper end 42 of the tube has a vertical spacing and diameter which establishes the angles $\beta_1$ and $\alpha_1$ as approximately equal, the amount of material sputtered on the inner and outer hole walls will be approximately equal, so that the hole will have the desired symmetrical deposition coverage. (These relationships are approximate, not exact, because we have simplified the design by considering only a 2-dimensional view of the sputtering geometry. A 3-dimensional analysis would be more accurate, but more complex.)

Once the tube diameter and the vertical position of the upper end 42 of the tube 12 are established, the only parameter which remains to be determined is the length of the tube, that is, the vertical position of the lower end 43. The objective is to shield the hole 100 near the substrate edge from material sputtered from an area of the target between the trajectory lines $x_3$ and r in FIG. 6. This requires extending the tube downward until it intersects the trajectory r between the hole 100 and the diagonally opposite edge of the target. This is the same requirement described in the preceding section entitled "Optimizing Design to Reduce Overhang Near Substrate Edge". Accordingly, the methodology for establishing the lower boundary 43 of the tube is the same as described in that section.

Since the design optimized for symmetry of hole coverage near the edge of the wafer, as just described, includes shielding the edge of the wafer from material sputtered from the center area and the diagonally opposite peripheral area of the target, the design achieves two objectives simultaneously: (1) symmetrical coverage of walls within holes near the wafer edge, and (2) reduction of overhanging deposition in holes near the wafer edge. In fact, the design to achieve symmetrical coverage can be considered a subset of the design to reduce overhang, in which the diameter of the tube and the vertical position of the upper end 42 are chosen to maximize symmetrical coverage of the hole walls.

OPTIMIZING DESIGN FOR BOTH EDGE AND CENTER OF SUBSTRATE

Figure 7:
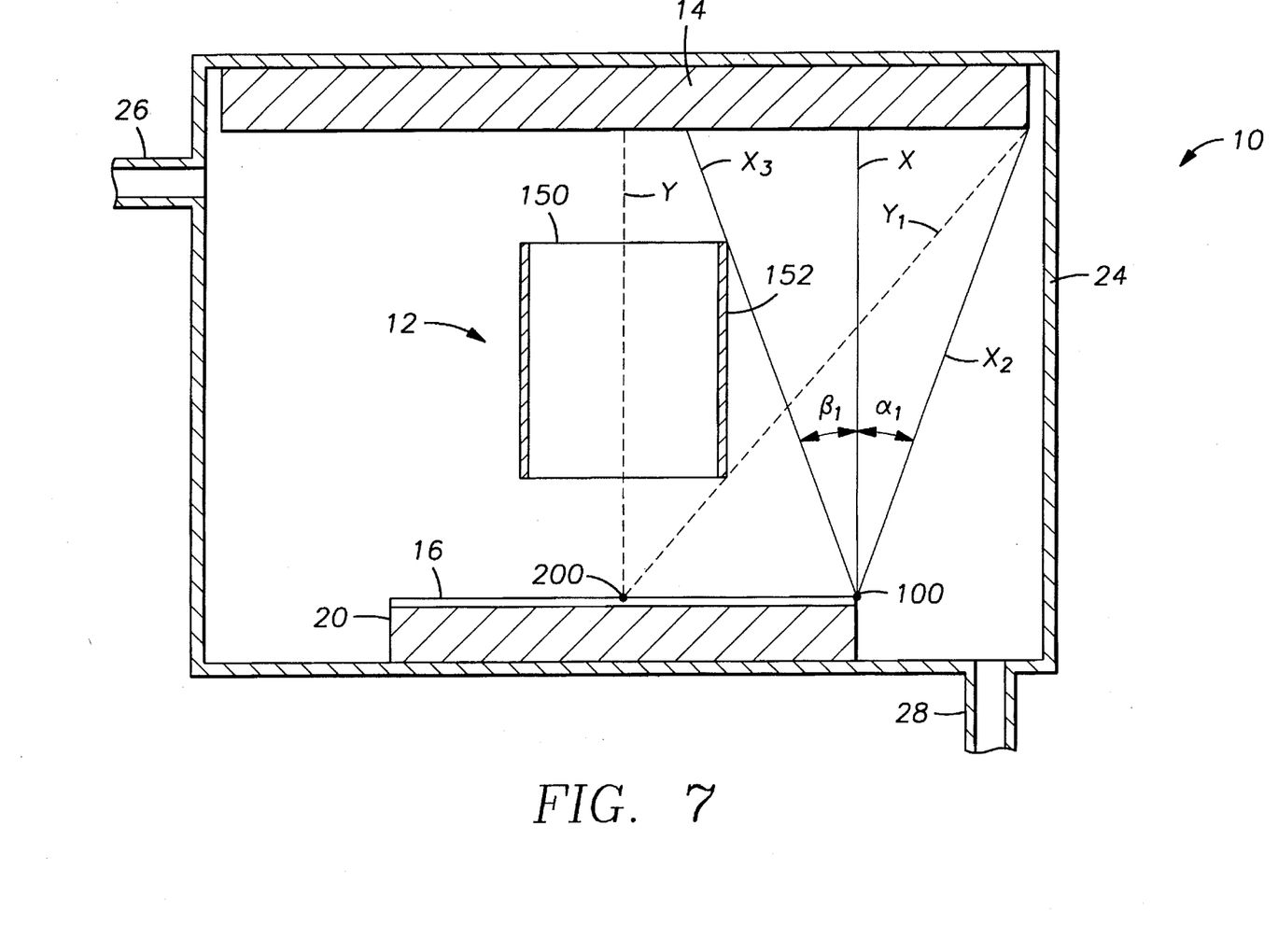
FIG. 7 is a simplified sectional view of the sputtering chamber including the tube of the present invention configured to eliminate overhang in the holes in the central region of the substrate while simultaneously providing a symmetrical target particle flux at the edge of the substrate.

FIG. 7 shows a tube design that combines the benefits of the previously described designs of FIGS. 5 and 6. In other words, it reduces or eliminates overhanging deposition both in holes near the center and in holes near the periphery of the substrate, and it improves symmetry of side wall coverage in holes near the periphery.

The combined design can be derived by starting with the previously described design that is optimized for best symmetry and minimal overhang in holes near the edge of the wafer, as shown in FIG. 6 and as described in the preceding section of this description. Examination of FIG. 6 reveals that extending the tube downward toward the substrate would not affect the deposition at the edge 100 of the wafer 16, and thus would not affect the previously optimized symmetry there. (This statement is only approximately accurate because FIG. 6 represents the sputtering geometry in two dimensions only. However, the statement is accurate enough for an initial design, which then can be adjusted iteratively for best performance.)

Extending the tube downward will affect the deposition at holes located inward the hole 100. If the tube is extended downward slightly as shown by the phantom line 48 in FIG. 6, the tube will shield holes 105 located inward of the wafer perimeter, in the same manner it shields outer holes 100, from the sputtered material originating from the diagonally opposite edge of the target and therefore having the most oblique trajectories. If the tube is extended further downward as shown in FIG. 7, the tube will shield all locations on the substrate from receiving material sputtered from the diagonally opposite edge of the target. To achieve this, the lower end 43 of the tube should be extended downward until it intersects a trajectory line $y_1$ extending from the center of the substrate to a point at the edge of the target. The resulting design beneficially reduces overhanging deposition in holes near the center of the wafer.

If the tube is extended further downward to intersect a trajectory line $y_2$ extending from a point 205 somewhat offset from the center of the substrate to the nearest edge of the target, then a wider region in the center will be shielded from the sputtered material originating near the edge of the target, and therefore having oblique trajectories.

OPTIMIZING THE TUBE FROM THE FIRST ORDER APPROXIMATION

The first order approximation of the proper size and location of the tube 12 is based upon 2-dimensional representations of the target area with respect to reference lines x and y, i.e., it is based upon a 2-dimensional representation of the 3-dimensional sputtering geometry. Therefore, the tube 12 of the first order approximation may not provide the optimum symmetry, optimum overhang elimination, or optimum combination of symmetry and overhang elimination possible with a tube 12. Further, the inclusion of the tube 12 between the substrate 16 and the target 14 will change the uniformity of the thickness of the film layer deposited on the substrate 16 as compared to an identical sputtering chamber in which the tube 12 is not present. Therefore, the size and/or position of the tube 12 determined by the first order approximation must be incrementally changed, and the affect of incremental change on the uniformity of the deposition thickness across the substrate 16 and on the symmetry of the deposition layer at various positions on the substrate 16 must be measured, so as to interatively optimize the tube size and position of the tube 12.

Each of the parameters of the target 14 and substrate 16 size and spacing, the target erosion profile, and the diameter, height and position of the tube 12 may be independently varied to iteratively determine the optimum combination of target 14 and substrate 16 size and spacing, the target erosion profile, and the diameter, height and position of the tube 12 in the chamber once the first order approximation of the tube size and position is made.

For example, if the substrate diameter is increased, the symmetry of the deposition flux reaching the edge will change because a smaller portion of the target area will be located to the outward side of the edge than will be located to the inward side of the edge. Likewise, if the substrate diameter is decreased, the symmetry of the deposition flux reaching the edge location will again change, because the target area on the outward side of the edge location will be greater than the target area on the inward side of the edge location.

With respect to the spacing of the substrate and target, with all other variables fixed, moving the substrate away from the target will tend to increase the asymmetry and decrease the deposition thickness adjacent to the edge location of the target. At the center of the target, the deposition thickness will be decreased, but the symmetry will remain the same, or substantially the same, as the substrate 16 to target 14 spacing is increased. If the substrate 16 to target 14 spacing is decreased, the edge deposition will again become more asymmetrical, but the deposition thickness will increase. Likewise, at the center of the substrate, the deposition layer will remain symmetrical but the deposition thickness will increase.

Changing the erosion profile will affect both the symmetry and the thickness of the deposition layer. If the diameter of an annular enhanced sputtering region is decreased, the tube 12 will block more of the target particles directed to the edge region of the substrate 16 and thereby reduce the flux of particles coming from the inward side of a hole. Thus, if the deposition in a hole adjacent the substrate edge is symmetrical, reducing the diameter at which the annular enhanced sputtering region is located will increase the asymmetry of the deposition. Additionally, the reduced target material flux reaching the edge location will result in a thinner deposition layer at that location. At the center of the substrate 16, the tube wall 40 blocks less of the material sputtered from the annular enhanced sputtering regions when the diameter of these regions are decreased, which results in an increased deposition thickness at the center of the substrate 16. However, this change will have no affect on the symmetry at the center of the substrate, because the target material flux will be increased symmetrically about the center location.

Changing the position of the upper and lower annular ends 42, 43 of the tube 12 with respect to the target 14 and the substrate 16 will also change the symmetry of the deposition flux. If the upper annular end 42 of the tube 12 is moved away from the target 14, the quantity of deposition material reaching the substrate edge from the inward side of the substrate 16 will be increased. Likewise, if the upper annular end 42 is moved toward the target 14, the target material reaching the substrate edge from the inward side of the substrate 16 will be decreased. Additionally, where the upper annular end 42 of the tube 12 is moved closer to the target 14, the overall quantity of material reaching all areas of the substrate 16 is decreased, and therefore the deposition layer will be thinner. Likewise, moving the upper annular end 42 away from the target 14 will increase the quantity of target material reaching all areas of the substrate 16, thereby increasing the thickness of the deposition layer.

Changing the distance between the lower annular end 43 of the tube 12 and the substrate 16 also affects the deposition thickness. Moving the lower annular end 43 toward the substrate 16 will decrease the quantity of target material reaching the center region of the substrate 16, whereas moving the lower annular end 43 away from the substrate 16 will increase the quantity of material reaching the center of the substrate 16. Additionally, moving the lower annular end 43 of the tube 12 away from the substrate 16 increases the quantity of target particles which can engage the substrate 16 at low angle trajectories, and thereby increase the likelihood that the deposition layer formed over the surfaces of the hole will result in overhang as shown in FIG. 3.

Changing the diameter of the tube 12 also changes the symmetry and thickness of the deposition layer. Where the tube 12 diameter is increased, the quantity of target material reaching the substrate edge from the inward side of the substrate 16 is decreased, and an increased, symmetrical flux reaches the center of the substrate 16. Where the tube 12 diameter is decreased, the quantity of target material reaching the substrate 16 edge is increased, and a decreased, but still symmetrically distributed, quantity of flux reaches the center of the substrate.

The iterative determination of the final size and location of the tube 12, the optimum substrate and target size and spacing, and the optimal magnetron configuration may be performed through trial and error. However, one skilled in the art could also perform the iterations on a properly programmed computer.

ALTERNATIVE CONDITIONS FOR THE FIRST ORDER APPROXIMATION

The first order approximations for the tube 12 for providing symmetry at the substrate edge (FIGS. 6 and 7) are based upon approximations of equal sputtering area being exposed to the substrate edge on both the inner and outer sides of the substrate edge. In reality, where the target includes enhanced sputtering regions such as regions 19, 21 (shown in FIG. 1), very little material will be sputtered from the portion of the target 14 located outwardly beyond the outer enhanced sputtering region 21. Therefore, the reference locations at which the reference lines x, r intersect the target 14 can be at the outermost edge of the outer enhanced sputtering region 21, rather than at the edge of the target 14. Additionally, the starting reference location for the tube 12, i.e., the position of the lower annular end 43 or upper annular end 42, may be reversed for each of the approximations.

Additionally, the position of the lower annular end 43 and tube wall 40 for blocking the center of the substrate 16 from the target edge (FIGS. 5 AND 7) may also be modified so that a central region of the substrate, and not just the substrate edge, is blocked by the wall 40. This will increase the area of the substrate over which the overhang reducing effect of the tube 12 is imposed.

THE EFFECT OF THE TUBE ON EDGE SYMMETRY AND OVERHANG

Figure 8:
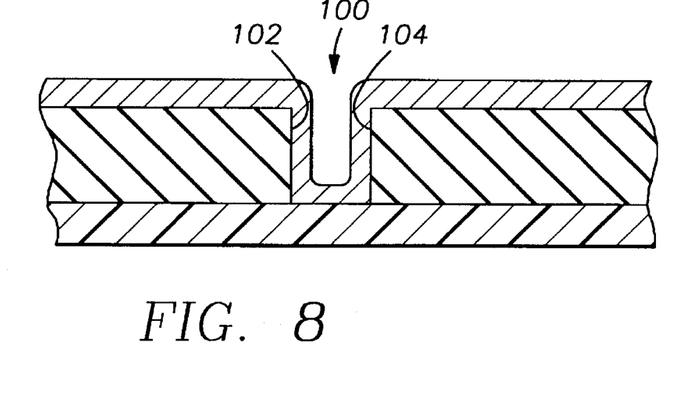
FIG. 8 is a partial sectional view of a hole location adjacent the edge of a substrate showing the conformal overage of the hole using the tube of the present invention.
Figure 9:
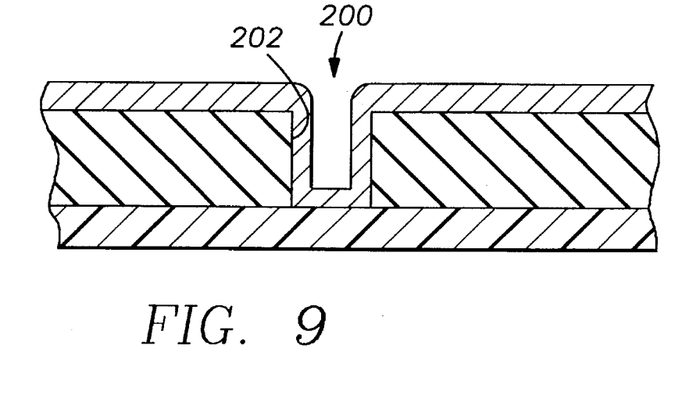
FIG. 9 is a partial sectional view of a hole location adjacent the center of a substrate showing the conformal coverage of the hole using the tube of the present invention.

Referring now to FIGS. 8 and 9, respectively, the effect of the tube 12 on the deposition formed in the hole 100 adjacent to the substrate edge, and on the deposition formed in the hole 200 at the substrate center, is shown. At the edge location, as shown in FIG. 8, the deposit formed in the hole 100 is symmetrical. This is a result of the optimization of the tube 12 to screen the target material flux to provide a symmetrical flux at the edge location. At the hole 200 located at the center of the substrate 16 (FIG. 9), the tube 12 does not change the symmetry of the flux, but the tube 12 does screen out the particles travelling most obliquely to the surface of the deposition receiving surface of the substrate 16 and thereby reduces the quantity of target material which builds up at the hole 200 entrance. The resulting deposit is symmetrical, but it does not include the overhang or spherical non-filled region created by non-collimated prior art chambers.

To provide optimal results with the tube 12, the pressure in the chamber should be maintained close to or below the pressure at which the mean free path of atoms within the chamber exceeds the distance between the target 14 and the substrate 16. By so maintaining the pressure in the chamber, the collisions between the target particles and the background gas atoms may be substantially ignored when optimizing the size and position of the tube 12.

THE MULTIPLE TUBE EMBODIMENT

Figure 10:
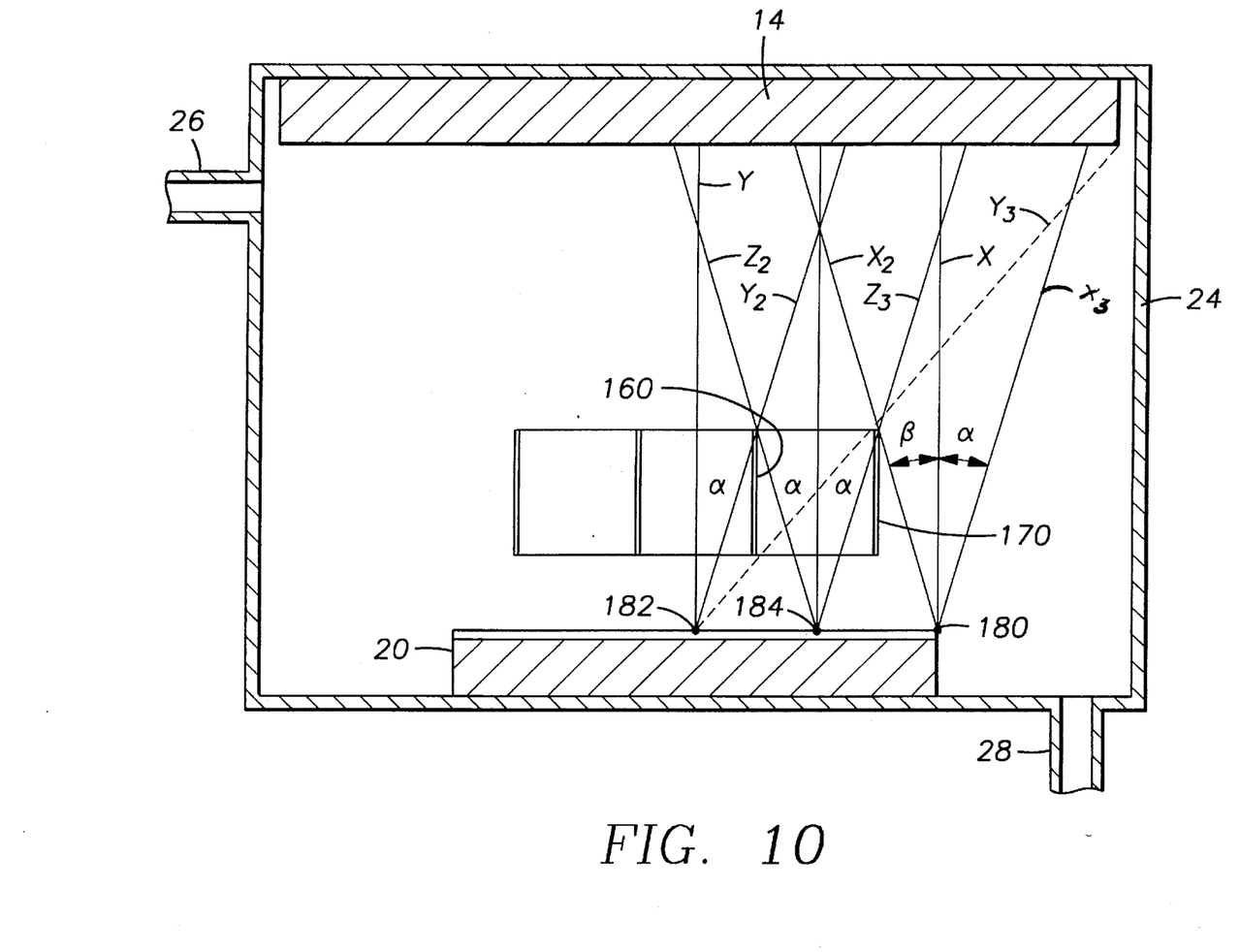
FIG. 10 is a simplified sectional view of the sputtering chamber including multiple tubes of the present invention.

Referring now to FIG. 10, a further embodiment of the invention is shown, wherein multiple tubes,, in the described embodiment an inner tube 160 and an outer tube 170, are shown. The size and position of the two tubes 160, 170 are again determined by first obtaining a geometrically based approximation of the size and position of the tubes 160, 170, and then iterating to a final configuration. Optimally, the tubes 160, 170 will provide three regions on the substrate 16 where a symmetrical flux is deposited: At the edge, the center, and a position between the edge and the center of thee substrate 16. Therefore, as a first order approximation, the upper surfaces of the tubes 160, 170 should be: positioned to create a symmetrical flux at these three locations, while the lower ends of the tubes 160, 170 should be positioned to block the target particles travelling most obliquely with respect to the top most surface of the substrate.

To begin the first order approximation, the target 14, the substrate 16, and the target to substrate spacing are first drawn to scale as shown in FIG. 10. Then, the reference line x is drawn perpendicular to the edge location (designated 180 in FIG. 8) on the substrate 16. Then, a reference line $x_3$ is drawn from the edge location 180 to the edge of the target 14, and a complementary reference line $x_2$ is drawn from the substrate to the target 14. The angle $\alpha$ between the line x and the reference line $x_3$ is equal to the angle $\beta$ between the reference lines x and $x_2$. Then, a reference line y is drawn perpendicular to the center location 182 of the substrate 16, and a reference line z is drawn perpendicular to the substrate 16 at a location 184 half-way between the edge and center of the substrate 16. A reference line $y_2$ is then drawn at the angle $\alpha$ to the reference line y, and lines $z_2$, $z_3$ are drawn on either side of the reference line z at the angle $\alpha$ with respect thereto. The intersection of line $y_2$ with line $z_2$, and the intersection of line $z_3$ with line $x_2$, establishes the upper end of the tubes 160, 170 to provide symmetrical flux at the edge position 180, center position 182 and intermediate position 184.

To establish the position of the lower surface of each of the tubes 160, 170, the tubes must extend a distance in the chamber sufficient to block particles from the edge of the target 14 from reaching the center of the substrate 16. For the chamber configuration of FIG. 10, this is accomplished by extending the wall of the inner tube 160 downwardly, until it is just below a line $y_3$ extending between the center location 184 and the edge of the target 14. The wall of the outer tube 170 is then extended downwardly by this same distance to provide the first order approximation of the size and location of the two tubes 160, 170.

From this first order approximation, the final configuration of the tubes 160 and 170 can be optimized by iteration, as was performed to optimize the single tube 12.

Although the multiple tube configuration is shown wherein each of the tubes 160, 170 have the same height, and the upper ends thereof are equally spaced from the target 14, the tubes 160, 170 may have different heights, or may have the same height but be spaced different distances from the target 14 (i.e., staggered), without deviating from the scope of the invention.

THE SELF CLEANING TUBE EMBODIMENT

During the deposition process, a portion of the material sputtered from the target 14 may deposit on the lower annular end 43, upper annular end 42 and the wall 40 of the tube 12. The particles which deposit on the lower annular end 43 will typically engage the tube 12 at low impact energies. When the target particles deposit on a surface with low impact energy they may form loosely attached powdery deposits on the deposition surface. These loosely attached deposits may later flake off the tube 12 surface and contaminate the substrate 16. Therefore, any object placed between the substrate 16 and the target 14, such as the tube 12, must be periodically cleaned to remove the material deposited on the surfaces thereof at low energies to ensure that deposits do not flake off and contaminate a substrate 16.

With the tube 12 of the present invention, this periodic removal can be avoided by rotating the tube 12 in the chamber 10 and thereby periodically reversing the positions of the lower annular end 43 and the upper annular end 42 with respect to the target 14. By alternately positioning the ends 42 and 43 adjacent to the surface of the target 14, a stream of high energy target particles will impact the ends 42 and 43 of the tube at periodic intervals, (i.e., when the end 42 or 43 is located adjacent to the target 14) to form a high energy impact, continuous, solidly attached film layer which covers and/or incorporates any loosely attached deposits and thereby obviates the need for periodic cleaning of the tube 12. The tube 12 may be rotated by operating the drive motor 78 to rotate the rod 70 attached thereto one or more times during the deposition of a material layer on a single substrate, or, if desired, it may be rotated to reverse the positions of the upper annular end 42 and the lower annular end 43 of the tube 12 after one, or more, substrates 16 are processed in the chamber 10. Preferably, each of the ends 42, 43 are maintained adjacent to and substantially parallel to the target 14 for equal periods of time over the life of the tube 12.

This method of extending the time between cleaning of the tube 12 may be applied to any physical collimation device wherein particle generation is a limiting factor in the length of time between collimator clearings, and where the physical collimator may be rotated without contacting the target 14, the substrate 16 or other chamber components.

The improved symmetry of the deposition layer enabled by the present invention is provided without the frequent maintenance associated with the prior art plate collimator sputtering apparatuses.

Those skilled in the art can easily and quickly determine, by creating a first order approximation and then iterating, the optimum size and spacing of one or more tubes 12 to provide the advantages of the invention with any specific target erosion profile. Likewise, each of the variables of substrate 16 size, target 14 size, target to substrate spacing, tube 12 size and placement, and the target erosion profile 17 may be modified to obtain the symmetry enhancing affect of tube 12 while also providing a uniform thickness film layer over the surface of the substrate 16. The use of one or more tubes between the substrate and the target provides collimation, to enable uniform, symmetrical, deposits in each hole on the substrate, and also provides a uniform deposition flux reaching all locations on the substrate, to enable a uniform deposit in the holes as measured from hole location to hole location on the substrate.

We claim:

1. An apparatus for sputter depositing a film on a substrate, comprising:

a chamber enclosing a sputtering target and a substrate support member, said substrate support member having a generally planar substrate receiving surface disposed generally parallel to the sputtering surface of the target;

means for sputtering said target;

a cylindrical member located between and spaced apart from said target and said substrate support member and having a single aperture therethrough bounded by an annular wall; and said annular wall includes an outer surface and a lower edge, wherein a point on the outer surface near the lower edge is positioned to block, and thereby prevent, particles sputtered from an edge of the target from reaching the center of the substrate receiving surface.

2. The apparatus of claim 1, wherein said annular wall further includes an inner surface and an upper edge, wherein a point on the inner surface near the upper edge is positioned to block, and thereby prevent, particles sputtered from the center of said target from depositing on the edge of the substrate receiving surface.

3. The apparatus of claim 1, wherein said aperture is a right cylindrical aperture.

4. The apparatus of claim 2, wherein said target extends outwardly beyond the edge of the substrate receiving surface, and said inner surface is positioned to block, and thereby prevent, the portion of the target surface located inwardly of the substrate receiving surface edge which exceeds the portion of the target extending outwardly of the substrate receiving surface edge from contributing target particles to the substrate receiving surface edge.

5. The apparatus of claim 1, wherein said cylindrical member is sized and positioned, with respect to the target and the substrate support member, to provide symmetrical target material flux at the edge and the center of the substrate receiving surface.

6. The apparatus of claim 1, wherein said annular wall is positioned to block, from the substrate receiving surface edge, that portion of the target area located inwardly of the substrate receiving surface edge which exceed the portion of the target area located outwardly of the substrate receiving surface edge.

7. The apparatus of claim 1, further including a second cylindrical member located about the perimeter of said cylindrical member.

8. The apparatus of claim 7, wherein said cylindrical member and said second cylindrical member have axes; and said axes are aligned co-linearly.

9. An apparatus for sputter depositing a film on a semiconductor substrate, comprising:

a chamber enclosing a sputtering target and a substrate support member, said substrate support member having a generally planar substrate receiving surface disposed generally parallel to the sputtering surface of the target;

means for sputtering said target; and a cylindrical member located between and spaced apart from said target and said substrate support member and having a single aperture therethrough bounded by an annular wall, said annular wall including an outer surface and a lower edge, wherein a point on the outer surface near the lower edge is positioned to intersect the paths of particles traveling from a point near an edge of the target to a point near the diagonally opposite area on the substrate receiving surface.

10. The apparatus of claim 9, wherein the annular wall further includes an inner surface, and wherein a point of the inner surface near the lower edge extends sufficiently close to the target so as to intersect the paths of particles traveling from the center of the target to a point near the periphery of the substrate receiving surface.

11. An apparatus for sputter depositing a film on a substrate, comprising:

a chamber enclosing a sputtering target and a substrate support member, said substrate support member having a generally planar substrate receiving surface disposed generally parallel to the sputtering surface of the target;

means for sputtering said target;

a cylindrical member located between and spaced apart from said target and said substrate support member and having a single aperture therethrough bounded by an annular wall; and said annular wall includes an inner surface and an upper edge, wherein a point on the inner surface near the upper edge is positioned to intersect the paths of particles traveling from that portion of the target area located inwardly of the substrate receiving surface edge whose area exceeds the area of the target located outwardly of the substrate receiving surface edge to an edge of the substrate receiving surface.

12. The apparatus of claim 11, wherein said annular wall includes an outer surface and a lower edge, wherein a point on the outer surface near the lower edge is positioned to intersect the paths of particles traveling from the edge of said target to the center of the substrate receiving surface.

13. The apparatus of claim 11, wherein said aperture is a right cylindrical aperture.

14. The apparatus of claim 11, wherein said cylindrical member is sized and positioned, with respect to the target and the substrate support member, to provide symmetrical target material flux at the edge and,the center of a substrate receded on the substrate receiving surface.

15. The apparatus of claim 11, further including a second cylindrical member located about the perimeter of said cylindrical member.

16. The apparatus of claim 15, wherein said cylindrical member and said second cylindrical member have axes; and said axes are aligned co-linearly.

17. The apparatus of claim 11, wherein said annular wall prevents overhang inducing particles from reaching the center of the top-most surface of a substrate received on said substrate support member.

18. A method of forming a deposition layer on a substrate, comprising the steps of:

providing a sputter deposition chamber having at least a target and a substrate therein;

spacing the target a long throw distance from the substrate;

sputtering the target to provide a flux of target particles for deposition on the substrate; and placing an annular member having an inner surface, an outer surface and a single aperture therethrough between and spaced apart from the substrate and the target, wherein the inner surface of the annular member intersects the paths of particles travelling from a point on the target to a point on the substrate.

19. The method of claim 18, wherein the annular member is a right annular member.

20. The method of claim 18, wherein the annular member includes an axis intersecting the center of the aperture positioned perpendicular to the surface of the substrate.

21. The method of claim 20, further including the step of positioning the annular member, with respect to the target and the substrate, so that target material sputtered from the edge of the target is prevented from reaching the center of the substrate.

22. The method of claim 18, wherein the annular member prevents the target material sputtered from one edge of the target from reaching the far edge of the substrate.

23. The method of claim 18, further including the step of positioning the annular member to block, and thereby prevent, that portion of the target area located inwardly of the substrate edge which exceeds the portion of the target area located outwardly of the substrate edge from contributing deposition material to the substrate edge.

24. The method of claim 18, wherein the inner surface of the annular member blocks, and thereby prevents, that portion of the target area located inwardly of the substrate edge which exceeds the portion of the target area located outwardly of the substrate edge from contributing deposition material to the substrate edge.

25. The method of claim 18, wherein the outer surface of said annular member blocks the edge of the target from the center of the substrate.

26. A method of forming a deposition layer on a substrate, comprising the steps of:

providing a sputter deposition chamber having at least a target and a substrate therein;

sputtering the target to provide a flux of target particles for deposition on the substrate;

placing an annular member having an inner surface, an outer surface and a single aperture therethrough between and spaced apart from the substrate and the target; and the target extends outwardly beyond the edge of the substrate, and the inner surface of said annular member is positioned to block, and thereby prevent, the portion of the target surface located inwardly of the substrate edge which exceeds the portion of the target extending outwardly of the substrate edge from contributing target particles to the substrate edge.

27. The method of claim 26, wherein the outer surface is positioned to prevent target particles sputtered from the edge of the target reaching the center of the substrate.

28. A method of forming a deposition layer on a substrate, comprising the steps of:

providing a sputter deposition chamber having at least a target and a substrate therein;

sputtering the target to provide a flux of target particles for deposition on the substrate;

placing an annular member having an inner surface, an outer surface, a lower edge and a single aperture therethrough between and spaced apart from the substrate and the target and wherein a point on the outer surface of said annular member near the lower edge is positioned to prevent target particles sputtered from the edge of the target reaching the center of the substrate.

29. The method of claim 28, wherein the target extends outwardly beyond the edge of the substrate, and the inner surface of said annular member is positioned to block, and thereby prevent, the portion of the target surface located inwardly of the substrate edge which exceeds the portion of the target extending outwardly of the substrate edge from contributing target particles to the substrate edge.

30. An apparatus for sputter depositing a film on a substrate, comprising:

a chamber enclosing a sputtering target and a substrate support member, said substrate support member having a generally planar substrate receiving surface disposed generally parallel to, and located a long throw distance from, the sputtering surface of the target;

means for sputtering said target; and a cylindrical member located between and spaced apart from said target and said substrate support member and having a single aperture therethrough bounded an annular wall, wherein an inner surface of the cylindrical member intersects the paths of particles travelling from a point on the target to a point on the substrate receiving surface.

31. The apparatus of claim 30, wherein said annular wall includes an outer surface positioned to intersect the paths of particles traveling from an edge of the target to the center of the substrate receiving surface.

32. The apparatus of claim 30, wherein said annular wall includes an inner surface positioned to intersect the paths of particles traveling from the center of said target to the edge of the substrate receiving surface.

33. An apparatus for sputter depositing a film on a substrate, comprising:

a chamber enclosing a sputtering target and a substrate support member, said substrate support member having a generally planar substrate receiving surface disposed generally parallel to the sputtering surface of the target;

means for sputtering said target; and, a cylindrical member located between and spaced apart from said target and said substrate support member and having a single aperture therethrough bounded by an annular wall, the annular wall having an inner surface, an outer surface, a lower edge and an upper edge, wherein a point on the outer surface near the lower edge of the annular wall is positioned to intersect the paths of particles travelling from the edge of the target to the center of the substrate receiving surface, and wherein a point on the outer surface near the upper edge of the annular wall is positioned to intersect the paths of particles travelling from the edge, of the target to the opposed edge of the substrate receiving surface.

* * * * *